United States Patent [19]

Allen et al.

[11] Patent Number: 4,851,297
[45] Date of Patent: * Jul. 25, 1989

[54] DOPANT COATED BEAD-LIKE SILICON PARTICLES

[75] Inventors: Robert H. Allen; Jameel Ibrahim, both of Baton Rouge, La.

[73] Assignee: Ethyl Corporation, Richmond, Va.

[ * ] Notice: The portion of the term of this patent subsequent to Dec. 6, 2005 has been disclaimed.

[21] Appl. No.: 212,231

[22] Filed: Jun. 27, 1988

Related U.S. Application Data

[63] Continuation of Ser. No. 126,203, Nov. 27, 1987, Pat. No. 4,789,596.

[51] Int. Cl.$^4$ .............................................. B32B 1/00
[52] U.S. Cl. ................................. 428/570; 428/404; 428/641; 156/620.4; 427/213
[58] Field of Search .................... 428/570, 641, 404; 252/950, 951; 156/620.4, 605; 427/213

[56] References Cited

U.S. PATENT DOCUMENTS

| | | | |
|---|---|---|---|
| 3,012,861 | 12/1961 | Ling | 427/213 |
| 3,012,862 | 12/1961 | Bertrand et al. | 427/213 |
| 4,789,596 | 12/1988 | Allen et al. | 428/570 |

*Primary Examiner*—L. Dewayne Rutledge
*Assistant Examiner*—David W. Schumaker
*Attorney, Agent, or Firm*—John F. Sieberth; Philip M. Pippenger

[57] ABSTRACT

Particles of silicon and a p or n carrier substance which are in spherical or spheroidal form, and suitable for use in the preparation of doped semiconductor devices, can be prepared by a fluidized bed technique for chemical vapor deposition of a carrier substance (B, P, As or Sb). The prepared products have a kernel of high purity polysilicon and a layer of silicon/dopant alloy upon the kernel. Optionally, the particles have a thin outer layer of silicon.

7 Claims, 2 Drawing Sheets

DOPANT COATED BEAD-LIKE SILICON PARTICLES

This application is a continuation of application Ser. No. 126,203 filed Nov. 27, 1987, now U.S. Pat. No. 4,789,596.

FIELD OF THE INVENTION

This invention pertains to high purity dopant mixtures for single crystal silicon manufacture. The novel materials of this invention are eminently suited for use in batch or continuous, Czochralski crystal pulling processes (for making single crystal silicon). The novel materials of this invention are made by a process which comprises chemical vapor deposition in a fluidized bed.

RELATED PRIOR ART

Single crystal silicon for electronic use is commonly prepared with relatively minute quantities of an elemet of Group III or Group V. The elements employed are usually selected from boron, phosphorus, arsenic or antimony. When incorporated in silicon, these elements change the electrical conductivity of the silicon by occupying normal silicon-atom positions in the crystalline lattice. The Group V elements (with five valence electrons) have one which is weakly bonded to the dopant element and easily excited into the conduction band. Hence, the Group V elements are known as electron donors, and silicon predominantly doped therewith is called n-type. Boron has three electrons which particiipate in covalent bonding, i.e. one less than silicon. Little energy is required to excite a valence electron into the fourth bond, and its introduction creates a hole in the valence bond. Boron is an electron acceptor, and acceptor doped silicon is termed p-type.

Because only relatively minute amounts of dopant elements are employed, it is not possible to weigh with the requisite accuracy the amount of dopant to be added to a normal sized batch of silicon to be doped. Accordingly, alternate procedures are commonly utilized in an attempt to produce doped silicon having the required dopant concentration. None of these procedures is entirely satisfactory. Generally speaking these procedures fall within three main categories.

One type of current practice comprises melting the dopant and silicon in an appropriate crucible, e.g. quartz. The mass obtained is cooled and then pulverized, sieved and blended. Due to differential freezing during cooling, dopant concentration variations occur both on the micro and macro levels. These variaions are not entirely removed by the crushing and blending procedures. Furthermore, impurities can be introduced during the crushing and blending operations. Consequently, a few test pulls are made with the doped alloy, the conductivity measured, and the conductivity values obtained are used to back calculate the dopant concentration level achieved. (Typically, the amount of useful material prepared by this method is about 50%).

A second general technique for making dopant alloys comprises making a single crystal from a heavily doped melt. The single crystal ingot is sliced, and the slices are characterized analytically to determine dopant concentration. The slices are then crushed and blended. As with the first technique discussed above, maintenance of purity and homogeneity can be significant problems in this process.

In the third, method, a small diameter (e.g. a ¼" doped single crystal rod) is pulled either by a float zone technique or from a doped melt. (For float zone operation, gaseous dopants are introduced into the chamber during the pulling process.) The concentration profile of the dopant is characterized analytically, and then small slugs are cut from the single crystal rod. These slugs are used as dopants for batch Czochralski pullers.

Because of non-homogeneity in all the above methods a single analytical characterization of a sample does not characterize the entire batch. Thus, variations in product are the rule, rather than the exception. Silicon wafer manufacturers have identified the variability in dopant concentration as a significant problem in their crystal growing processes. The materials provided by this invention have much less variability in dopant concentration than materials of the prior art. Furthermore, the process of this invention is less susceptible to the introduction of impurities than the prior art methods mentioned above. Consequently the dopant alloys of this invention are a significant improvement over materials which are available in current practice.

SUMMARY OF THE INVENTION

This invention comprises mixtures of silicon and dopant elements suitable for use in the production of silicon semiconductor devices. These products are spherical or substantially spherical in shape.

The products of this invention are of two general types. Both types have a nucleus or center portion of high purity silicon, and a p or n carrier substance deposited on the silicon nucleus. In the first type, the deposit containing the p or n carrier substance is an alloy of the carrier substance or substances with silicon. In the second type, the layer on the silicon core is substantially silicon-free. Thus in the second type, the layer deposited on the central silicon core is the p or n carrier substance per se, or a mixture of such substances. The p or n substance in both types of products is selected from boron, phosphorus, arsenic, and antimony (B, P, As and Sb).

Each of the two types of products contains a subset of products. In the subsets, the layer of the p or n substance, or the layer of p or n substance(s) alloyed with silicon, is covered with a relatively thin layer of silicon. This optional layer may serve to protect the p or n carrier substance layer from abrasion, and/or from contamination from the environment. It may also make the p or n carrier element layer adhere better to the central silicon core, and thereby protect it from spalling off. This latter utility may be desirable when the p or n element is not present as an alloy with silicon.

The products of this invention are produced by a fluidized bed process which comprises chemical vapor deposition of a p or n substance in a bed of silicon particles. The chemical vapor deposition technique employed depends on the type of product to be made. For the first type of product, the fluidized bed of silicon particles is contacted, under reaction conditions, with a source of silicon and a source of p or n substance. Thus, for example, the gaseous mixture may comprise silane as the silicon source, and diborane as a boron source. Preferably, these materials are admixed with a carrier gas such as hydrogen. The process is conducted at a temperature high enough to thermally decompose the silane and diborane, thus causing a layer of silicon and boron to be deposited on the silicon particles. For the second type of product the silicon source is omitted.

The p or n substance is deposited on the silicon particles in the absence or substantial absence of silicon.

As indicated above, the process of this invention utilizes bead-like particulate silicon as a starting material. Polysilicon produced in a fluidized bed process has this form. Accordingly it is preferred that the products of this invention be made from polysilicon formed in a fluidized bed rather than from particles made by comminuting larger surfaces by a crushing or similar process. The latter type of particles typically have irregular planar faces. Thus, the entire product can be made using a succession of deposition steps using fluidized bed techniques. For example, the polysilicon kernels or nuclei can be formed by chemical vapor deposition of silicon on fluidized silicon seed particles. Next, the polysilicon particles so produced can be fluidized, and a coating of silicon and boron, or boron per se, added atop the core of silicon. Optionally, a layer of silicon can the be deposited on the layer having the boron or other carrier substance.

The various deposition steps described can be conducted in the same fluidized bed reactor, but it is not necessary to do so. Preferably, the alloy layer or layer of carrier element is deposited in a second reactor, i.e. a reactor different from the one in which the polysilicon nucleus or inner portion is prepared.

This invention has several advantages over existing dopant production methods:

(1) It produces substantially homogenous dopant alloy with lessened concentration variation.

(2) The physical form of the dopant alloy (substantially uniform spherical free flowing particles) makes it ideally suited for continuous Czochralski pulling systems.

(3) It can produce very high purity doped material.

(4) Compared to prior art processes, a single sample analysis from a batch is more capable of certifying the dopant concentration of the whole batch.

(5) High yields can be achieved in the process.

(6) Energy consumption per Kg of dopant produced is much lower.

(7) It is a more efficient and economical process.

(8) The product has lessened tendency to segregate according to size.

DESCRIPTION OF THE DRAWINGS

The drawing in FIG. 1 is an illustration, not to scale, of an illustrative particle of this invention. Particle 1 is composed of a polysilicon nucleus 10. That nucleus is overlayed with layer 12, which comprises a mixture of (i) polysilicon and (ii) a p or n type carrier material, e.g. boron or phosphorus. Superimposed on the alloy layer is outer layer 14, which is polysilicon. It envelops or enwraps the alloy layer, and protects it from abrasion or from contamination. This layer is optional. Thus, layer 12 may be the outer layer, and layer 14 may be absent. The relative sizes of the layers in the drawing are not limiting, and are for purposes of illustration only.

Figure 1:
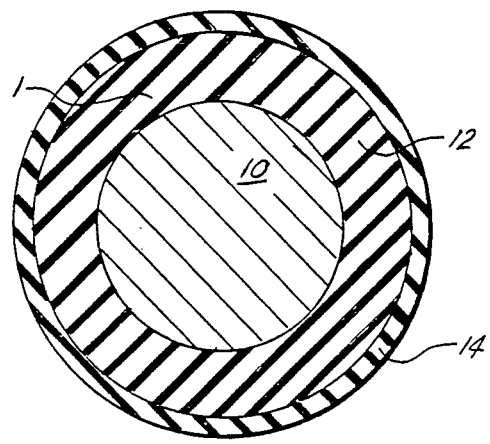
Figure 2:
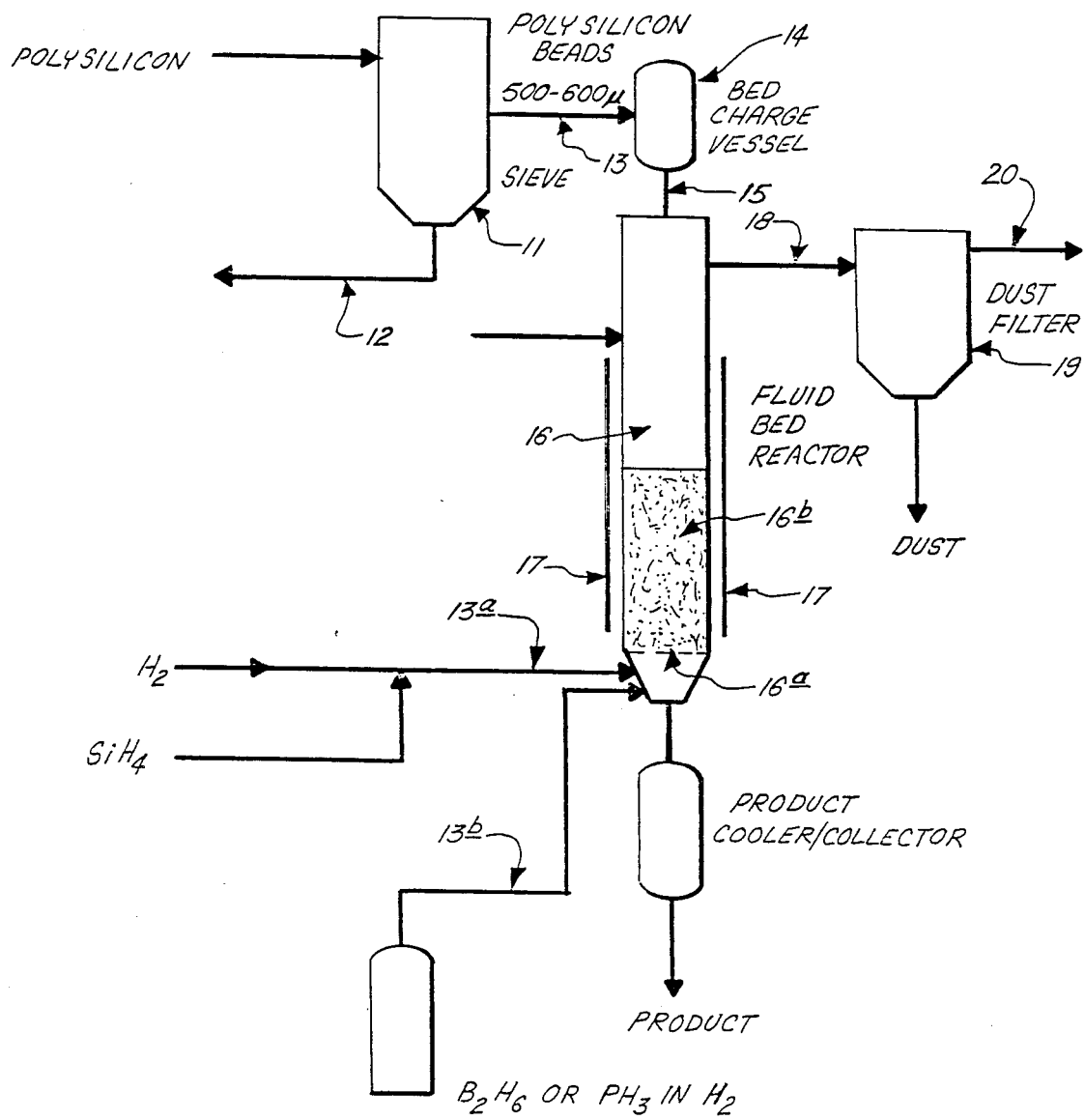
FIG. 2 is a flow diagram of an apparatus for producing product of this invention. As shown, polysilicon beads that have been prepared by a fluidized bed process are preferably introduced into a sieve device 11. A sieve device need not be used. However, if the starting particles are sieved the product will be more homogeneous and the product particles will have less tendency to segregate according to size. Particles of a selected narrow size distribution, e.g. 500-600 microns, or 450-500 microns, or 600-650 microns are taken from the sieve device via line 13 for charging vessel 14. Polysilicon particles from the sieve that are not of the desired size are removed via line 12.

Particles from vessel 14 are fed through line 15 into fluidized bed reactor 16, which is externally heated by surrounding heater 17. A mixture of hydrogen and silane or other silicon source is fed into the reactor through line 13a. (This stream can be omitted if the p or n carrier substance is to be deposited per se, i.e. without silane.)

A source of p or n carrier substance, optionally mixed with a diluent gas such as hydrogen, is fed into the reactor through line 13b. The source may be any convenient, thermally decomposable compound of B, P, As or Sb. Of these compounds, hydrides and halides are preferred, especially the simple binary compounds such as diborane, $B_2H_6$, phosphine, $PH_3$, arsine, $AsH_3$, stibine, $SbH_3$, and their fluorine or chlorine analogs such as $BF_3$, $BCl_3$ or $PCl_3$.

The gases and vapors flow through distributor 16a into particle bed 16b with sufficient motive force to maintain the particles in fluidized suspension. The source of p or n carrier substance, and the silicon source if present, thermally decompose to provide a layer of carrier substance (with or without silane) on the fluidized bed particles.

Off gases, and any silicon fines produced by homogeneous decomposition of silane or other silicon source, are removed through line 18. The dust or fines are removed by filter 19. The filtered gases can be sent via line 20 to be recovered, flared or recycled. After the desired amount of p or n substance (with or without silicon) has been deposited, the flow(s) of hydride(s) or other source compound(s) are stopped.

Optionally, the flow of silicon source in hydrogen can be continued to deposit a coating of silicon or desired thickness.

After the desired deposition(s) are completed, the product material are removed from the reactor and recovered for sale or use.

DESCRIPTION OF PREFERRED EMBODIMENTS

This invention provides in bead-like form, mixtures of polysilicon and a p or n carrier substance such as B, P, As, or Sb. As indicated above and described more fully below, this invention comprises a silicon nucleus substantially surrounded by layer which has the carrier substance. Preferably, a major portion of the particulate product is the center silicon core. In this preferred embodiment, a relatively thin layer which has the carrier substance is on the central nucleus. It is to be understood however, that this invention also comprises products made from a relatively small nucleus and a relatively thick layer having the carrier element. Generally speaking, this type of product is not as readily made, and is more expensive than the product with the relatively thick cores. Hence, it is preferred that the product have a relatively thick silicon core and a relatively thin layer of carrier substance (or carrier substance alloyed with silicon) on the silicon nucleus.

It is easier and more economical to make materials from undoped polysilicon; hence it is preferred that the dopant element not be within the central nucleus or core.

As mentioned above, a fluidized bed is used to deposit a layer of boron, phosphorus, arsenic, or antimony on a silicon particle, and the layer containing the carrier substance can be (i) an alloy of that substance with silicon, or (ii) the carrier substance per se. Thus, for purposes of illustration, this invention comprises particulate products having the following compositions:

| EXAMPLES OF PRODUCTS OF THIS INVENTION | | | |
|---|---|---|---|
| Product Type | Central Core | Layer of Carrier Substance | Optional Outer Layer |
| 1 | Silicon | Boron or phosphorus | — |
| 2 | Silicon | Boron or phosphorus with silicon | — |
| 3 | Silicon | Boron or phosphorus | Silicon |
| 4 | Silicon | Boron or phosphorus with silicon | Silicon |

In the above table, the term "boron or phosphorus with silicon" signifies a layer of boron with silicon, or a layer of phosphorus with silicon. Arsenic or antimony can replace the boron or phosphorus.

In a preferred embodiment, this invention comprises a product selected from types 2 and 4, i.e. a silicon alloy composition in bead or bead-like form having a center and major portion of high purity silicon, and a layer enveloping the center kernel or nucleus composed of silicon alloyed with another element. The alloy layer has silicon in a major proportion, and a minor amount of a p or n carrier substance. Preferably, the spheres or spheroidal particles of this invention are roughly uniform in size.

Stated another way, this invention comprises as a preferred embodiment, a dopant alloy composition suitable for use in doping silicon with a dopant selected from p or n carrier substances such as B, P, As and Sb, the alloy being in free flowing form, and consisting essentially of spherical or spheroidal particles of a narrow size distribution, the particles having an inner nucleus of high purity silicon, and a relatively thin layer around the nucleus composed of high purity silicon alloyed with a p or n carrier substance such as boron, phosphorus, arsenic or antimony. The dopant alloys of this invention are suitable for batch or continuous Czochralski processes for preparing doped, single crystal silicon.

This invention also comprises as a preferred embodiment, the layer of silicon and p or n carrier substance (e.g. B, P, As or Sb), which is deposited upon the polysilicon beads. The layer of silicon and p or n substance is produced by a fluidized bed process which comprises thermally decomposing compounds of silicon and a p or n element, to deposit the layer of silicon and carrier substance on the polysilicon beads.

Typically, the products of this invention have a relatively minor amount of carrier substance; e.g. B, P, As or Sb. Thus, the particulate products of this invention can have from about 10 to about 3000 ppma of one or more of these elements. More preferably, the amount of carrier substance is in the range of from about 100 to about 2000 ppma. It is to be understood that the concentration of the carrier substance in the products of this invention is not critical, and therefore this invention comprises materials having greater or lesser concentrations than specifically set forth above.

As stated above, the products of this invention are spherical or substantially spherical. Generally, they have a diameter within the range of from about 100 to about 2000 microns. More preferably, their diameter is within the range of from about 300 to about 700 microns, and most preferably from about 500 to about 600 microns. It is to be understood that the size of the particles is not critical, and products having smaller or larger particles than mentioned above are within this invention.

As indicated above, the layer containing the carrier substance can be comparatively thick or thin and thin layers are preferred because they are easier and more economical to prepare. Preferably, the layer with the carrier substance is less than 150 microns; more preferably from about 5 to about 100 microns, and most preferably from about 50 to about 100 microns.

When the particulate products of this invention have an outer silicon layer atop the layer with the p or n carrier substance, the outer layer is preferably from about 1 to about 10 microns thick. It can be thicker or thinner since its size is not critical.

Another preferred embodiment of this invention is a process for producing silicon/dopant compositions (of the type described above) comprising:

A fluidized bed process for preparing a silicon composition in free flowing particulate form, said process comprising:

fluidizing a bed of spherical or substantially spherical particles of high purity elemental silicon, i.e. silicon particles having a purity sufficient for use in electronic devices, e.g. solar panels or semiconductors, with a motive gas comprising a source of a dopant element (B, P, As or Sb);

said particle bed being maintained at a temperature above the decomposition temperature of said dopant element source, whereby said source is thermally decomposed and the dopant element (i.e. carrier substance) is deposited on said particles of high purity silicon.

In this process, the dopant element source is a compound of the dopant element. Compounds with relatively low decomposition temperatures are preferred. Typical sources are hydrides and halides of the dopant elements. Preferred compounds are binary hydrides and halides such as $B_2H_6$, $PH_3$, $AsH_3$, $SbH_3$, $BCl_3$, $PCl_3$ and the like. The hydrides are highly preferred since they are generally thermally decomposable at lower temperatures, and the hydrogen by-product is easier to handle from the reactor materials of construction viewpoint, than a halogen-containing stream.

To prepare products of Types 2 and 4—see the Table above—, the motive gas which passes through the fluidized bed also contains a source of silicon. Various compounds such as silicon hydrides, silicon halides and silicon-hydrogen-halogen compounds can be used. By way of illustration, silane, $SiH_4$, dichlorosilane, $SiH_2Cl_2$, trichlorosilane, $SiHCl_3$ and silicon tetrachloride, $SiCl_4$ can be used as well as the fluoro-, or bromoanalogs of these compounds. Silane is highly preferred because of its lower decomposition temperature, and the hydrogen by-product is easier to handle than a halogen material.

Typically, the silane or other silicon source, and the hydride or other souce of dopant element, are admixed with a gas prior to passage through the bed of fluidized particles. Hydrogen is a typical diluent gas; however, other insert gases such as helium, argon, and the like can also be used. It is known in the art that the use of such a diluent gas has many advantages. For example, the hydrogen or other gas dilutes the compounds that are to be thermally decomposed and thereby promotes good mixing with the bed particles. It also provides motive force to maintain the particles in fluidized suspension.

Use of such gases dilutes the silane concentration, thereby lowering the rate of formation of silicon dust or fines by homogeneous decomposition of silane.

For the purpose of this invention, the silane is hydrogen concentration used to prepare the layer of silicon/dopant alloy is preferably in the range of 1-6 mole %, more preferably about 4 to about 6 mole percent. Other silicon sources are preferably employed in these ranges. The amount of silane or other silicon source introduced is sufficient to provide a silicon/dopant layer of desired thickness. The concentration of the source of B, P, As or Sb, is selected to provide the desired amount of p or n substance deposited on the particle bed, as discussed below.

The exact conditions utilized to deposit the layer having the dopant element are important, but not critical. Generally, it is desirable to use good fluidized bed process techniques, as they apply to the equipment to be used, and the nature or type of product to be prepared. For commercial operations, the objective to prepare the product at acceptable cost will also be borne in mind.

Preferably, the silicon particulate used as a starting material has a narrow size distribution, e.g. a range of 150 microns or less, preferably 50 to 100 microns. Preferably, the particles are substantially free of the planar surfaces and surface boundaries found in materials prepared by comminuting larger particles.

The process of this invention is conducted using a temperature above the thermal decomposition temperatures of the silicon source and the source of the p or n carrier substance(s). When silane is used as the silicon source, preferred temperatures are between 600° and 700° C.; more preferably from about 620° to about 650° C. The decomposition temperature of the source of the p or n carrier substance is preferably below such temperatures. The preferred process pressure is ambient pressure, but higher or lower pressures can be employed if desired. The flow of gases will be selected to maintain the bed of particles in a fluidized state. A flow rate (U) at or slightly above the minimum flow ($U_{min}$) to keep the bed fluidized will be selected. Typically, the rate of flow can be defined by the relationship $U/U_{min}=2.0$ to 3.0. Somewhat higher or lower rates can be used.

For a given reactor, there will be a preferred bed height range; this will define a range for preferred operation. Thus for example, for a particular reactor, the initial bed height might be within a certain preferred range, e.g. 1.5-2 feet, and the final bed height after the product is made should not exceed a given preferred value, e.g. 1.5× the starting bed height. Within such parameters, one can determine the range of the amount by weight of the dopant element layer to be deposited.

For any specific reactor to be utilized, there will be a range of acceptable motive gas flow rates. This range will in part determine the diameters of the starting material and of the product so that the bed will remain fluidized during operation.

Generally, an objective of a process of this invention will be the preparation of a product having a given concentration of dopant element ($C_{DP}$). In this regard, an operator can apply the relationship:

$$C_{DP} = C_{DL} \times \left(1 - \left[\frac{D_1}{D_2}\right]^3\right)$$

where:

$C_{DP}$ is the concentration of dopant element in the final product;

$C_{DL}$ is the concentration of dopant in the dopant layer deposited, and $D_1$ and $D_2$ are respectively, the initial and final diameters of the particle. Using this relationship, the operator can determine how much dopant is to be adder per any selected thickness of the dopant layer.

To illustrate this invention and not to limit it, a desirable product of this invention can be produced by using a fluidized bed of silicon particles having a diameter within the range of 500-600 microns and an average of 550 microns. As an example, an initial bed of such particles will weigh 25 to 41 kg and a typical final bed weight will be 40-60 kg.

Typical product particles will have a dopant layer of 50 microns thickness (i.e. a diameter increase of one hundred microns). Using the illustrative particles mentioned above, the product particle size will be 600-700 microns for an average of 650 microns.

Illustrative but non-limiting operating conditions are:
bed temperature 620°-650° C.;
feed gas temperature 325°-375° C.;
$U/U_{min}$ 1.5-3.5;
SiH$_4$ concentration in feed gas ~4-6%;
SiH$_4$ conversion ~50-90%.
Diborane concentration-30-40 ppm

EXAMPLE 1

About 6 kg of high purity polysilicon particles having an average size of 550 microns and a size range of 500-600 microns were charged to a fluidized bed reactor having an internal diameter of about 4.75 inches. (These particles were in bead or bead-like form, and had been prepared by a fluidized bed process comprising thermal decomposition of silane with deposition of silicon on a bed of polysilicon seed particles. After operation of the fluidized bed process, the product was sieved to obtain the 500-600 micron sized starting material used in this example.)

The bed was maintained at a temperature of 630°-640° C. while being fluidized with a flow of silane in hydrogen, (silane concentration was about 5 mole %) admixed with about 35 ppm B$_2$H$_6$. The source of the diborane comprised a mixture of 1060 ppm (molar) B$_2$H$_6$ in hydrogen. The average flow of hydrogen was about 5.1 scfm. The flow of gases was maintained for about 3.5 hours. The silane conversion was 82%.

Material balance indicated that the thickness of the silicon/boron layer deposited on the polysilicon particles was about 24 microns. Inspection of etched cross-sections of several particles indicated that the layer of silicon and boron had grown very uniformly, with an average thickness of about 25 microns; confirming the thickness expected by material balance.

Boron concentration determined by resistivity measurements (using Hall effect equipment) on three float zoned single crystals were 137.5, 137.0 and 131.0 ppma.

The particles had a low, acceptable surface dust content (less than about 0.1%).

If desired, the particles produced above, could be coated with a thin, e.g. 1-10 micron thick outer layer, by continuing the silane/hydrogen feed until the outer silicon layer of desired thickness was deposited.

The process of this example can be modified to prepare products having a diameter of 100 to 2000 microns, boron in concentrations of about 10 ppma, 750 ppma, 1500 ppma or 3000 ppma. The deposited silicon/boron alloy layer can be from about 5 to about 100 microns thick; preferably 50-100 microns.

The above process can be repeated using a silane/hydrogen mixture of 1-6 mole percent silane, a bed temperature of 620°-650° C. and a $U/U_{min}$ of 1.5-3.5. Typical diborane conversions are 25-60%. The process can be repeated using $PH_3$ instead of diborane, to produce similar particles having phosphorus concentrations of about 10 and about 300 ppma. Similar products with arsenic or antimony can be obtained using arsine or stibine as the source of the carrier substance as illustrated below.

EXAMPLE 2

In this example, the initial bed particle size range was 500-600 microns. The inlet silane concentration in hydrogen was about 5 mole percent. The phosphorus source was $PH_3$ in hydrogen; 2607 ppm molar. The inlet $PH_3$ concentration was 145 ppm. The operating temperature was about 690° C.

The phosphorus concentration was determined by resistivity measurements (using Hall effect equipment) of six single crystal slices from two float zoned single crystal samples (three slices from each crystal) to be 478.4, 508.6, 484.0, 444.8, 476.6, and 526.2 ppma.

Material balance indicated that the new CVD layer of silicon incorporating the phosphorus to be about 29 microns.

Examination of etched cross-sections of several particles indicated that the CVD layer was grown uniformly around the particles with an average thickness of about 30 microns.

The products produced by the process may be used as dopant alloys in batch or continuous Czochralski crystal pulling processes. The products are added to polysilicon and melted to produce a batch of product having a concentration of dopant element in a selected range.

Having the above description of the invention and preferred embodiments thereof, a skilled practitioner may make changes, alterations, or substitutions without departing from the scope and spirit of the appended claims.

We claim:

1. A silicon composition in bead or bead-like form and having (i) a center portion of high purity silicon and, (ii) a layer on said center portion, said layer having a p or n carrier substance, said composition being produced by a fluidized bed process comprising passing a stream of deposition gas comprising a mixture of a silicon source and a binary hydride of a p or n carrier element through a fluidized bed of substantially spherical silicon particles maintained at a temperature above the decomposition temperatures of said silicon source and said hydride, whereby an alloy of silicon and said element is deposited on said particles of high purity elemental silicon.

2. The composition of claim 1, wherein said silicon source is silane.

3. The composition of claim 1, wherein said carrier substance is selected from the class consisting of boron, phosphorus, arsenic and antimony.

4. The composition of claim 3, wherein said carrier substance is boron.

5. The composition of claim 3, wherein said carrier substance is phosphorus.

6. The composition of claim 4, wherein said boron is present in a concentration of from about 10 to about 3000 ppma.

7. The composition of claim 5, wherein said phosphorus is present in a concentration of from about 10 to about 3000 ppma.

* * * * *